(12) United States Patent
Mezei et al.

(10) Patent No.: US 10,796,058 B1
(45) Date of Patent: Oct. 6, 2020

(54) PARTIAL RECONFIGURATION OF INTEGRATED CIRCUITS USING SHELL REPRESENTATION OF PLATFORM DESIGN

(71) Applicant: Xilinx, Inc., San Jose, CA (US)

(72) Inventors: Nicholas A. Mezei, Thornton, CO (US); Steven Banks, Sunnyvale, CA (US); Meiwei Wu, San Jose, CA (US); Raymond Kong, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 74 days.

(21) Appl. No.: 16/141,723

(22) Filed: Sep. 25, 2018

(51) Int. Cl.
*G06F 30/392* (2020.01)
*G06F 30/394* (2020.01)
*G06F 30/3312* (2020.01)

(52) U.S. Cl.
CPC ........ *G06F 30/392* (2020.01); *G06F 30/3312* (2020.01); *G06F 30/394* (2020.01)

(58) Field of Classification Search
CPC ...... G06F 30/392; G06F 30/30; G06F 30/331; G06F 30/3312; G06F 30/3315; G06F 30/39
USPC .................................. 716/100, 113, 116, 122
See application file for complete search history.

(56) References Cited

U.S. PATENT DOCUMENTS

| | | | |
|---|---|---|---|
| 7,308,666 B1 | 12/2007 | Li | |
| 9,026,978 B1 | 5/2015 | Liu | |
| 9,864,830 B1 | 1/2018 | Jha et al. | |
| 2005/0024158 A1* | 2/2005 | Andrasic | H03K 3/0322 331/57 |
| 2006/0164139 A1* | 7/2006 | Chong | H03L 7/0814 327/158 |
| 2007/0018733 A1* | 1/2007 | Wang | H03L 7/093 331/16 |
| 2008/0309393 A1* | 12/2008 | Sun | G01K 7/015 327/298 |
| 2017/0068765 A1* | 3/2017 | Sinnadurai | G06F 30/392 |

* cited by examiner

*Primary Examiner* — Paul Dinh
(74) *Attorney, Agent, or Firm* — Kevin T. Cuenot (57) ABSTRACT

A platform design including a module black-box instance is loaded into computer hardware. Using the computer hardware, synchronous boundary crossings between a static region and the module black-box instance of the platform design are identified and objects of the platform design included in the synchronous boundary crossings are marked. Using the computer hardware, unmarked objects are removed from the platform design to generate a shell circuit design. A custom circuit design is implemented based on the shell circuit design and timing constraints corresponding to objects remaining in the shell circuit design.

20 Claims, 4 Drawing Sheets

PARTIAL RECONFIGURATION OF INTEGRATED CIRCUITS USING SHELL REPRESENTATION OF PLATFORM DESIGN

TECHNICAL FIELD

This disclosure relates to integrated circuits (ICs) and, more particularly, to implementing circuit designs in an IC using partial reconfiguration and a shell representation of a platform design.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits may be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs may also be implemented in other ways, e.g., using fuse or antifuse technology. The phrase "programmable IC" may include, but is not limited to, these devices and further may encompass devices that are only partially programmable. For example, one type of programmable IC includes a combination of hard-coded transistor logic and a programmable switch fabric that programmably interconnects the hard-coded transistor logic.

Implementing a circuit design within an IC, whether a programmable IC or an application specific IC (ASIC), entails processing the circuit design through a design flow. The design flow includes multiple, different phases. These phases generally include synthesis, placement, and routing. In general, synthesis refers to the process of generating a gate-level network list or "netlist" from a high-level description of a circuit or system. Placement refers to the process of assigning elements of the synthesized circuit design to particular instances of circuit blocks and/or resources having specific locations on the target IC. Routing refers to the process of selecting or implementing particular routing resources, e.g., wires and/or other interconnect circuitry, to electrically couple the various circuit blocks of the target IC after placement.

SUMMARY

In one or more embodiments, a method includes loading, using computer hardware, a platform design including a module black-box instance, identifying, using the computer hardware, synchronous boundary crossings between a static region and the module black-box instance of the platform design, and marking, using the computer hardware, objects of the platform design included in the synchronous boundary crossings. The method further includes removing, using the computer hardware, unmarked objects from the platform design to generate a shell circuit design and implementing, using the computer hardware, a custom circuit design based on the shell circuit design and timing constraints corresponding to objects remaining in the shell circuit design.

In one or more embodiments, a system includes a memory configured to store program code and a processor coupled to the memory. The processor, in response to executing the program code, is configured to initiate operations. The operations include loading a platform design including a module black-box instance, identifying synchronous boundary crossings between a static region and the module black-box instance of the platform design, marking objects of the platform design included in the synchronous boundary crossings, removing unmarked objects from the platform design to generate a shell circuit design, implementing a custom circuit design based on the shell circuit design and timing constraints corresponding to objects remaining in the shell circuit design.

In one or more embodiments, a computer program product includes a computer readable storage medium having program code stored thereon. The program code is executable by a processor to perform operations. The operations include loading a platform design including a module black-box instance, identifying synchronous boundary crossings between a static region and the module black-box instance of the platform design, marking objects of the platform design included in the synchronous boundary crossings, removing unmarked objects from the platform design to generate a shell circuit design, and implementing a custom circuit design based on the shell circuit design and timing constraints corresponding to objects remaining in the shell circuit design.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to implementing circuit designs in an IC using partial reconfiguration and a shell representation of a platform design. A custom circuit design is implemented within an IC in combination with a platform design. The custom circuit design may be a user specified circuit design that is to be implemented within the IC using partial reconfiguration. The custom circuit design is implemented within a partial reconfiguration (PR) region of the IC. A PR region of an IC refers to a region of programmable circuitry that is reserved for implementing one or more different custom circuit designs dynamically over time. An IC can include more than one PR region. The platform design is implemented in the portions of the IC external to the PR region(s) also referred to as the "static region" of the IC. The static region of the IC refers to programmable circuitry of the IC that implements a circuit design that does not change, e.g., remains static, while circuitry in the PR region(s) can be changed to implement other, different custom circuit designs over time while the circuitry in the static region continues to operate uninterrupted.

In implementing a custom circuit design, the electronic design automation (EDA) tools must interface the custom circuit design with the platform design. The custom circuit design must undergo synthesis, placement, and routing, for example, to ensure that the custom circuit design correctly connects to the platform design in the IC. This process is time consuming, often taking many hours and significant computational resources to complete.

In accordance with the inventive arrangements described herein, the platform design is processed to generate a shell circuit design. In one or more embodiments, the shell circuit design is an abstract representation of the platform design. The shell circuit design includes sufficient design detail of the platform design so as to allow the EDA tools to implement the custom circuit design. The shell circuit design is created by the EDA tools by selectively removing portions of the platform design. The shell circuit design is significantly smaller in size than the platform design. By using the shell circuit design instead of the platform design, the EDA tools are capable of implementing the custom circuit design in significantly less time and with significantly fewer computational resources than is the case with other techniques.

In addition, the shell circuit design, being an alternative or abstracted representation of the platform design, allows a platform design provider to explicitly hide the netlist and/or other design information for the platform design from other parties including the creator of the custom circuit design. A party with malicious intent, for example, could design a custom circuit design for integration with a platform design. If the details of the platform design (e.g., the netlist and/or other design information) were exposed, the party with malicious intent could design a custom circuit design to compromise the platform design, the target IC itself, and/or another system in which the target IC is included. In accordance with the inventive arrangements described herein, the custom circuit designer need only access the shell circuit design, which improves overall security of the hardware acceleration computing infrastructure.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
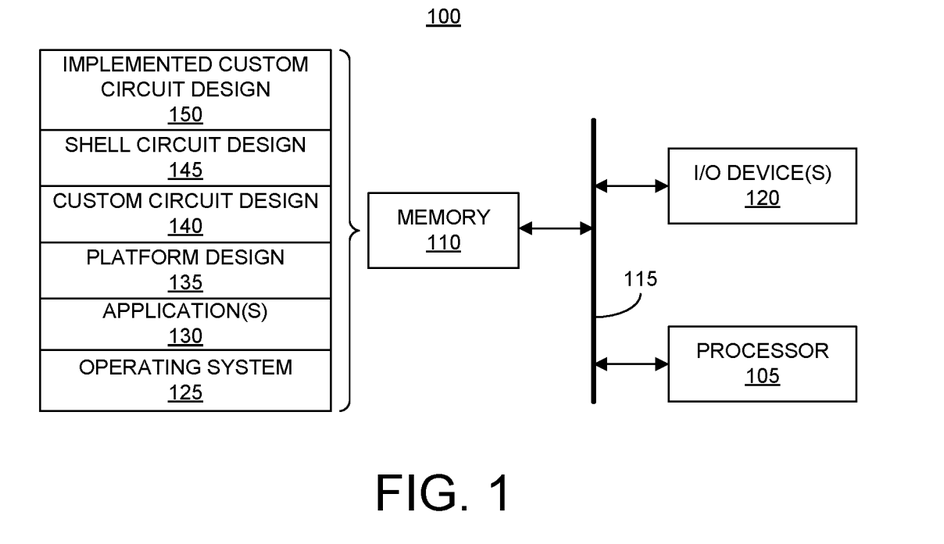
FIG. 1 illustrates an example system for use with one or more embodiments described herein.

FIG. 1 illustrates an example system 100 for use with one or more embodiments described herein. System 100 is an example of computer hardware that may be used to implement a computer, a server, a portable computer such as a laptop or a tablet computer, or other data processing system. A system or device implemented using computer hardware is capable of performing the various operations described herein relating to processing a circuit design for implementation within an IC.

In the example of FIG. 1, system 100 includes at least one processor 105. Processor 105 is coupled to memory 110 through interface circuitry 115. System 100 is capable of storing computer readable instructions (also referred to as "program code") within memory 110. Memory 110 is an example of computer readable storage media. Processor 105 is capable of executing the program code accessed from memory 110 via interface circuitry 115.

Memory 110 includes one or more physical memory devices such as, for example, a local memory and a bulk storage device. Local memory refers to non-persistent memory device(s) generally used during actual execution of program code. Examples of local memory include random access memory (RAM) and/or any of the various types of RAM that are suitable for use by a processor during execution of program code (e.g., dynamic RAM or "DRAM" or static RAM or "SRAM"). A bulk storage device refers to a persistent data storage device. Examples of bulk storage devices include, but are not limited to, a hard disk drive (HDD), a solid-state drive (SSD), flash memory, a read-only memory (ROM), an erasable programmable read-only memory (EPROM), electrically erasable programmable read-only memory (EEPROM), or other suitable memory. In particular embodiments, system 100 includes one or more cache memories (not shown) that provide temporary storage of at least some program code to reduce the number of times program code must be retrieved from a bulk storage device during execution.

Memory 110 is capable of storing program code and/or data. For purposes of illustration, memory 110 stores an operating system 125, one or more application(s) 130, a platform design 135, and a custom circuit design 140. In one or more embodiments, application(s) 130 include an EDA application. The EDA application, when executed by processor 105, is capable of performing the various operations described herein relating to generation of a shell circuit design 145 from platform design 135 and generating an implemented custom circuit design 150 from custom circuit design 140 using shell circuit design 145.

Platform design 135 and custom circuit design 140 may be specified in any of a variety of different formats including, but not limited to, hardware description language (HDL), EDIF, an internal binary format, or other suitable form. Timing constraints can be specified in an XDC format or another suitable timing constraint specification format.

In generating implemented custom circuit design 150, for example, the EDA application, as executed by system 100, is capable of performing operations of a design flow (e.g., synthesis, placement, routing, and/or bitstream generation). Implemented custom circuit design 150 can be implemented within a target IC, e.g., as a partial configuration bitstream. The target IC includes programmable circuitry. In one or more embodiments, the target IC has an architecture the same as or similar to the architecture described in connection with FIG. 6.

System 100, e.g., processor 105, is capable of executing operating system 125 and application(s) 130 to perform the operations described within this disclosure. As such, operating system 125 and application(s) 130 may be considered an integrated part of system 100. Further, it should be appreciated that any data used, generated, and/or operated upon by system 100 (e.g., processor 105) are functional data structures that impart functionality when employed as part of the system.

Examples of interface circuitry 115 include, but are not limited to, a system bus and an input/output (I/O) bus. Interface circuitry 115 may be implemented using any of a variety of bus architectures. Examples of bus architectures include, but are not limited to, Enhanced Industry Standard Architecture (EISA) bus, Accelerated Graphics Port (AGP), Video Electronics Standards Association (VESA) local bus, Universal Serial Bus (USB), and Peripheral Component Interconnect Express (PCIe) bus.

System 100 further may include one or more I/O devices 120 coupled to interface circuitry 115. I/O devices 120 may be coupled to system 100, e.g., interface circuitry 115, either directly or through intervening I/O controllers. Examples of I/O devices 120 include, but are not limited to, a keyboard, a display device, a pointing device, one or more communication ports, and a network adapter. A network adapter refers to circuitry that enables system 100 to become coupled to other systems, computer systems, remote printers, and/or remote storage devices through intervening private or public networks. Modems, cable modems, Ethernet cards, and wireless transceivers are examples of different types of network adapters that may be used with system 100.

System 100 may include fewer components than shown or additional components not illustrated in FIG. 1 depending upon the particular type of device and/or system that is implemented. In addition, the particular operating system, application(s), and/or I/O devices included may vary based upon system type. Further, one or more of the illustrative components may be incorporated into, or otherwise form a portion of, another component. For example, a processor may include at least some memory. System 100 may be used to implement a single computer or a plurality of networked or interconnected computers each implemented using the architecture of FIG. 1 or an architecture similar thereto.

The inventive arrangements described within this disclosure are also capable of providing improved operation of system 100. System 100, for example, is capable of performing the operations necessary to create implemented custom circuit design 150, e.g., synthesis, placement, routing, and/or bitstream generation, in less time and using fewer computational resources (memory, processor time, etc.) than would otherwise be the case had shell circuit design 145 not been created and used as described herein. Thus, the inventive arrangements support faster execution and operation of system 100 while performing various stages of a design flow.

In particular embodiments, shell circuit design 145 is used in cases where programmable ICs are used to provide Function(s) as a Service (FaaS). FaaS may be hosted by one or more interconnected computing systems arranged in an online or "cloud" computing environment. For example, system 100 may be included in such a cloud computing environment.

As used herein, the term "cloud computing" may refer to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service. Particular embodiments, cloud computing generally supports the FaaS model where functions are hardware accelerated, specified as custom circuit designs, and implemented within programmable ICs operating under control of host systems (e.g., computer system). Other examples of cloud computing models are described in the National Institute of Standards and Technology (NIST) and, more particularly, the Information Technology Laboratory of NIST.

The inventive arrangements, however, are not intended to be limited to operation within a cloud computing environment. The operations described herein can be performed using one or more data processing systems organized in various computational architectures.

Figure 2:
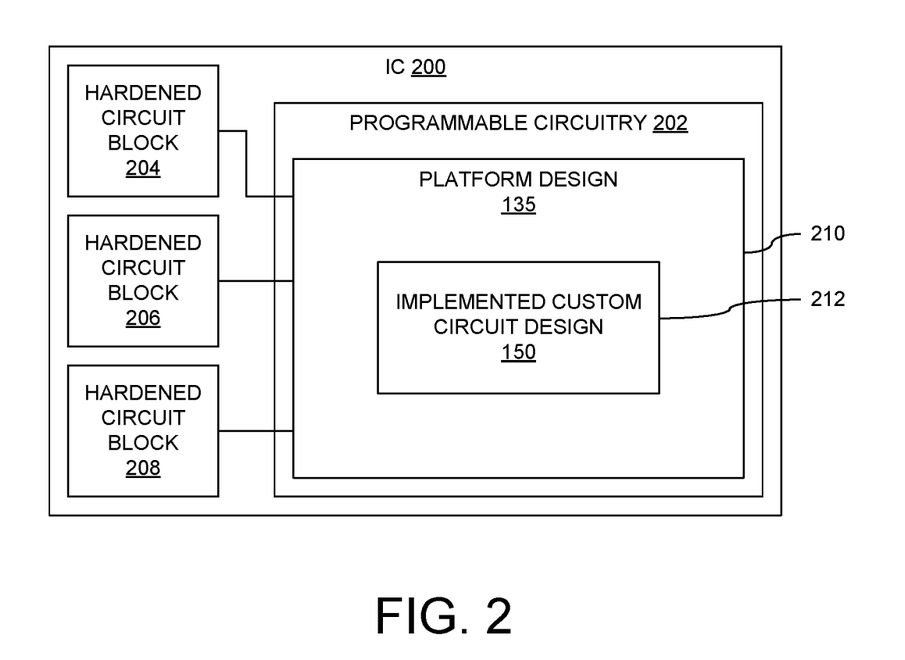
FIG. 2 illustrates an example implementation of a platform design and a custom circuit design within an integrated circuit (IC).

FIG. 2 illustrates an example implementation of a platform design and a custom circuit design within an IC 200. IC 200 is an example of a programmable IC. In the example of FIG. 2, IC 200 includes programmable circuitry 202. Programmable circuitry 202 is capable of implementing any of a variety of circuit designs including platform design 135 and implemented custom circuit design 150. In the example of FIG. 2, IC 200 includes hardened circuit blocks 204, 206, and 208. Hardened circuit blocks 204-208 represent circuitry such as processor(s) capable of executing program code, transceiver(s), a direct memory access (DMA) circuit, a memory controller, and/or one or more communication interfaces such as PCIe endpoints, USB ports, and the like. The particular number of hardened circuit blocks shown in FIG. 2 is for purposes of illustration and not limitation. In one or more embodiments, IC 200 does not include hardened circuit blocks. In other embodiments, IC 200 includes more hardened circuit blocks or fewer hardened circuit blocks than shown in FIG. 2.

In the example of FIG. 2, platform design 135 is implemented within a static region 210 of programmable circuitry 202. Static region 210 refers to the region of programmable circuitry 202 used to implement platform design 135. Static region 210 generally provides infrastructure circuitry that supports operation of implemented custom circuit design 150 (hereafter custom circuit design 150). Custom circuit design 150 is implemented within a PR region 212 of programmable circuitry 202. PR region 212 refers to the region of programmable circuitry 202 that is reserved for and used to implement one or more custom circuit designs (e.g., different custom circuit designs) over time. As different custom circuit designs are implemented in PR region 212, circuitry in static region 210 continues to operate uninterrupted.

In one or more embodiments, platform design 135 connects custom circuit design 150 to hardened circuit blocks 204-208 thereby allowing custom circuit design 150 to communicate with circuits and/or systems external to IC 200. In one or more other embodiments, platform design 135 implements "soft" versions of one or more of the hardened circuit blocks 204-208 thereby enabling custom circuit design 150 to communicate with circuits and/or systems external to IC 200 without hardened circuit blocks 204-208.

As an illustrative and nonlimiting example, a host system is capable of communicating with custom circuit design 150 through hardened circuit blocks 204-208 and/or platform design 135. The host system is capable of offloading tasks to IC 200 and, more particularly, to custom circuit design 150 for processing. In general, IC 200 is mounted on a printed circuit board or card (e.g., a hardware accelerator). The card also includes RAM that is coupled to IC 200. The host system is capable of offloading tasks to custom circuit design 150 by storing data within the RAM on the card. The host system, for example, sends the data to a bus endpoint implemented in platform design 135 and/or implemented as one of hardened circuit blocks 204-208. A DMA may also be included in platform design 135 and/or implemented as one of hardened circuit blocks 204-208 to facilitate data transfer through the bus endpoint. The data is then passed to a memory controller also implemented in platform design 135 and/or implemented as one of hardened circuit blocks 204-208. Custom circuit design 150 is capable of accessing the data from the RAM, processing the data, and writing results to the RAM through the memory controller. The host system may retrieve the results generated by custom circuit design 150 from the RAM using the bus endpoint, the DMA, and the memory controller.

In particular embodiments, platform design 135 is specified as a partial configuration bitstream that is loaded into IC 200 to implement platform design 135 as physical circuitry within static region 210 of programmable circuitry 202. Similarly, custom circuit design 150 is implemented as a partial configuration bitstream that is loaded into IC 200 to implement custom circuit design 150 as physical circuitry within PR region 212 of programmable circuitry 202. Different custom circuit designs may be implemented as described herein, and then loaded into IC 200 within PR region 212 over time. Platform design 135 implemented in programmable circuitry 202 and hardened circuit blocks 204-208 are capable of continuing to operate and communicate with one or more external systems (e.g., RAM and/or the host system) while PR region 212 undergoes partial reconfiguration to implement a different custom circuit design. Each of the custom circuit designs, once implemented, is capable of interacting with circuits and/or systems external to IC 200 by way of hardened circuit blocks 204-208 and/or platform design 135.

Figure 3:
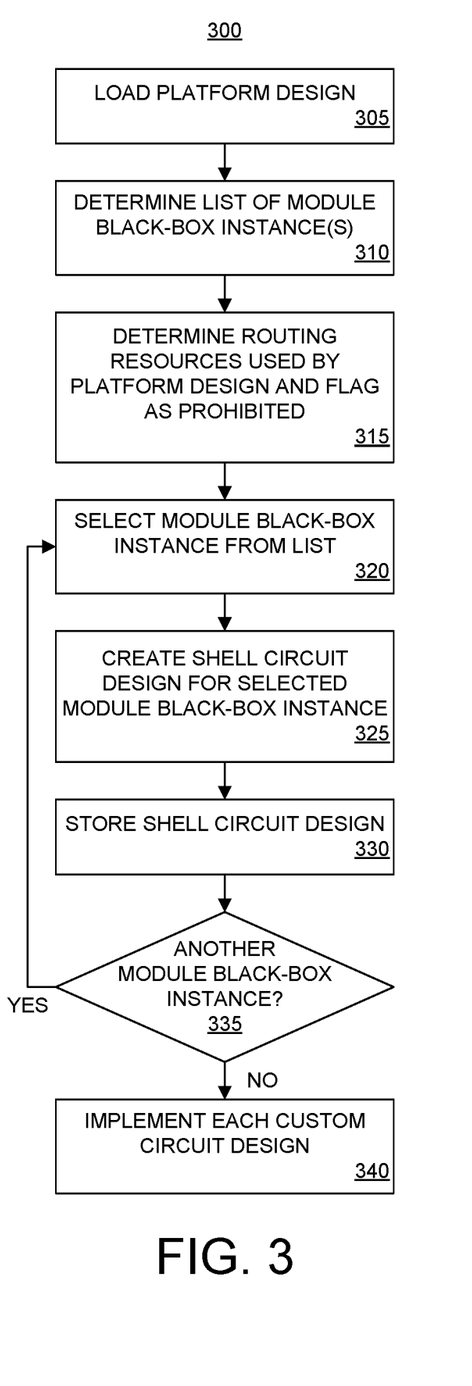
FIG. 3 illustrates an example method of implementing a shell circuit design.

FIG. 3 illustrates an example method 300 of implementing a shell circuit design. Method 300 is performed by a data processing system such as the system described in connection with FIG. 1. In one or more embodiments, the platform design is a fully placed and routed circuit design. Still, the platform design includes one or more modules that are "black-boxed" or empty. These modules are referred to as "module black-box instances." For purposes of implementation, each custom circuit design, e.g., a netlist of the custom circuit design, is inserted into a module black-box instance of the platform design for implementation within a target IC. The platform design may include one or more different module black-box instances, where each module black-box instance is capable of receiving a custom circuit design for implementation. A platform design that includes more than one module black-box instance is capable of implementing more than one custom circuit design concurrently.

In block 305, the system loads a platform design. For example, in block 305, the system loads the platform design into runtime memory. The platform design includes one or more "module black-box instances." The platform design is fully placed and routed. In one or more embodiments, each "module black-box instance" is an empty partial reconfiguration (PR) module. An empty PR module is implemented as an empty logical module, e.g., a data structure, specified using hardware description language (HDL) with a "partial reconfiguration" attribute associated therewith.

In one or more embodiments, each of the module black-box instances is an empty PR module that corresponds to a particular custom circuit design or plurality of custom circuit designs that are implemented in the module black-box instance. In particular embodiments, each module black-box instance includes or lists the particular pins of the platform design to which the corresponding custom circuit design(s) to be implemented therein must connect in order to connect to the platform design. The pins, also referred to as partition pins, define signal crossings between a static module (a module of HDL implemented in a static region of the IC) such as the platform design and a PR module (e.g., as implemented in a PR region) or between two or more PR modules (e.g., as implemented in two or more different PR regions).

Since each custom circuit design is created for implementation within a particular module black-box instance of the platform design, in cases where the platform design includes more than one module black-box instance, the particular module black-box instance in which each custom circuit design is to be implemented is specified or otherwise annotated for the custom circuit design. Such is the case since each module black-box instance will have different pins and pin configurations for connecting to custom circuit designs.

In block 310, the system determines a list of each module black-box instance included in the platform design. For example, the system is capable of parsing the platform design to identify each of the module black-box instances included therein. In block 315, the system determines the routing resources used by the platform design. The system flags the routing resources used by the platform design as prohibited for use in implementing any custom circuit design. By designating routing resources used by the platform design as prohibited, the system does not utilize such routing resources when implementing, e.g., routing, the custom circuit design(s). Marking routing resources used by the platform design as prohibited prevents contention for the routing resources by the custom circuit design(s) and possible short-circuits when the platform design and custom circuit design(s) are implemented in the target IC. The system does not use prohibited routing resources to route the custom circuit design.

In block 320, the system selects a module black-box instance from the list. In block 325, the system creates a shell circuit design for the selected module black-box instance. The system is capable of marking one or more objects of the platform design considered to be necessary for implementing the custom circuit design corresponding to the selected module black-box instance. For example, the system is capable of determining synchronous boundary crossings between the static region and the module black-box instance of the platform design and marking such objects included in the synchronous boundary crossings. The system removes those objects that are not marked for preservation from the platform design. The remaining objects of the platform circuit design are stored as the shell circuit design.

In one or more embodiments, rather than operating on the original or only copy of the platform design, the system may create a copy of the platform design for use in generating each shell circuit design. This preserves the availability of the original platform design for subsequent use and/or purposes.

In block 330, the system stores the shell circuit design. For example, the system is capable of storing the shell circuit design in persistent memory. In one or more embodiments, the shell circuit design is stored as a placed and routed netlist, in an internal binary format, or using EDIF. Further, the system is capable of associating the shell circuit design with one or more of the custom circuit design(s) for use in implementing each associated custom circuit design. In one or more other embodiments, the system writes the shell circuit design to memory as a Design Checkpoint File. A Design Checkpoint File may be a package file, e.g., a compressed container capable of storing multiple files, that includes the netlist, an internal binary format, and/or an EDIF version of the shell circuit design. The system is also capable of storing timing constraints associated with the shell circuit design. The system can store the associated timing constraints in runtime memory or in persistent memory such as in the Design Checkpoint File (e.g., in a binary format), in a proprietary format, or as text in XDC format.

In block 335, the system determines whether another module black-box instance of the platform design remains to be processed. In response to determining that another module black-box instance remains to be processed, method 300 loops back to block 320 to select a further module black-box instance for processing. In response to determining that no further module black-box instances remain to be processed, method 300 continues to block 340.

In block 340, the system implements each custom circuit design. For example, the system is capable of selecting a custom circuit design and the corresponding or associated shell circuit design for processing. When implementing a custom circuit design, the system need only load the custom circuit design and the shell circuit design corresponding to the custom circuit design into runtime memory. The entirety of the platform design is not required to be accessed or loaded into runtime memory to implement the custom circuit design. Similarly, only those timing constraints for objects that are still included within the shell circuit design need be loaded into runtime memory and used to implement the custom circuit design. As such, any timing constraints relating to objects removed from the platform design to create the shell circuit design are not used in implementing the custom circuit design. The system is capable of synthesizing, placing, and routing the custom circuit design using the corresponding shell circuit design and timing constraints for objects included in the shell circuit design.

By significantly reducing the amount of data for the platform design and corresponding timing constraints used when implementing the custom circuit design, the time required to perform complex tasks such as synthesis, placement, and/or routing is significantly reduced compared to other techniques for implementing the custom circuit design where the entire platform design is loaded into memory along with all of the timing constraints for the platform design. The operations described for block 340 may be performed for each custom circuit design using the shell circuit design corresponding to that custom circuit design.

In one or more embodiments, the system also generates a partial configuration bitstream specifying the actual circuitry to be implemented within the target IC for each of the custom circuit designs. The partial configuration bitstreams for different custom circuit designs corresponding to the same PR region can be loaded into the target IC at different times in order to implement the different custom circuit designs within the PR region of the target IC as needed over time. The partial configuration bitstreams for different custom circuit designs of different PR regions can be loaded into the target IC concurrently and/or at different times as may be required.

Figure 4:
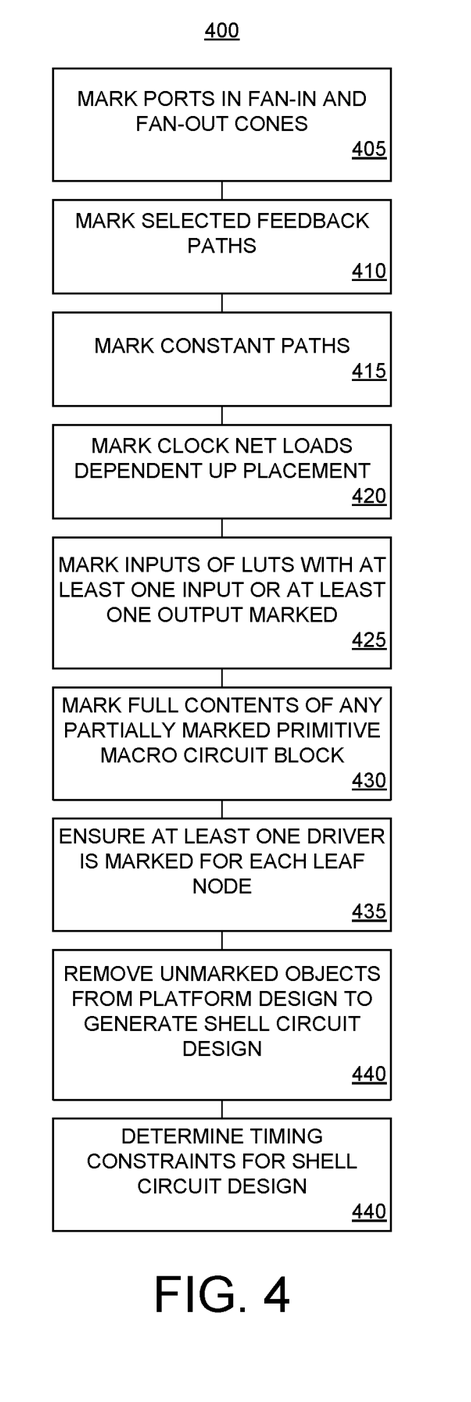
FIG. 4 illustrates an example method of creating a shell circuit design.

FIG. 4 illustrates an example method 400 of creating a shell circuit design. In particular embodiments, method 400 may be performed to implement block 325 of FIG. 3. As such, the system has loaded the platform design into runtime memory for purposes of generating a shell circuit design for a selected module black-box instance. Method 400 differs from other techniques for implementing a shell circuit design in that an explicit marking of timing constrained objects from the platform design is not performed. Rather than preserving each portion of the platform design that is referenced by any timing constraint, the embodiments described herein begin by keeping and preserving only the logic and/or circuitry from the platform boundary (synchronous boundary crossings as previously described) to first level synchronous elements, thus resulting in a significantly smaller footprint for the platform design for purposes of implementing the custom circuit design(s). Certain other circuit structures, for example, constant paths and lookup tables (LUTs), may also be preserved as part of the shell circuit design in accordance with the embodiments described below.

In block 405, the system marks ports in the fan-in and fan-out cones of the platform design. The system processes the ports of the target platform that interface with the module black-box instance. In one or more embodiments, the system selects a partition pin from the selected module black-box instance. The system determines whether the partition pin is an input pin or an output pin of the module black-box instance. In the case of an output partition pin, the system traverses down a signal path from the selected partition pin forward into the platform design and continues until a first synchronous circuit element is reached in the platform design. In particular embodiments, the synchronous circuit element is a flip-flop. In one or more other embodiments, the synchronous circuit element is a block RAM, a DSP, or other circuit block that includes a flip-flop. The system marks the synchronous circuit element and any other logic encountered in the path from the output partition pin to the synchronous circuit element for preservation. For example, the system would also mark any LUTs encountered in the path between the output partition pin and the synchronous circuit element.

In the case of an input partition pin to the module black-box instance, the system traverses down a signal path from the selected partition pin backward into the platform design and continues until a first synchronous circuit element is reached. As discussed, examples of synchronous circuit elements include a flip-flop, a block RAM, a DSP, or other circuit block that includes a flip-flop. The system marks the synchronous circuit element and any other logic encountered in the path from the input partition pin to the synchronous circuit element for preservation. For example, the system would also mark any LUTs encountered in the path between the output partition pin and the synchronous circuit element.

The system repeats this process for each partition pin specified by the selected module black-box instance. By marking each of the synchronous circuit elements of the platform design encountered as described, the system is preserving the circuitry and/or logic of the platform design included in the synchronous boundary between the static region and the PR region. In this manner, the system identifies and preserves synchronous boundary crossings between the custom circuit design and the target platform. This allows the system to implement the custom circuit design. Further, preservation of the synchronous circuit elements provides synchronous boundary starting and/or stopping points for timing analysis when implementing the custom circuit design.

As discussed, in method 400, marking of all timing constrained objects of the platform design is not performed. Rather, only selected objects of the platform design are marked for preservation in the shell circuit design. In block 410, the system marks each feedback path of the platform design that involves a phase-locked loop (PLL) or a mixed-mode clock manager (MMCM) circuit block.

In block 415, the system marks constant paths of the platform design. The system is capable of marking constants of the platform design that propagate to any cell that is already marked (at that time), whether marked through fan-in cone marking, fanout cone marking, etc. The system queues the constant and marks the fan-in cone of the constant for preservation. For example, the system marks each constant path of the platform design that propagates or feeds into another marked area, object, or topology of the platform design. The system is also capable of marking any constant paths that feed into the module black-box instance.

In some cases, timing analysis may be sensitive to values of constants present and/or propagated in a circuit. For example, if a logic AND gate has a first input port driven by a constant logic 0, the output of the AND gate will be constant logic 0 regardless of the signal propagated to a second input port of the AND gate. In that case, the system preserves the path with the constant logic 0 to ensure that a logic 0 is still propagated. Further, in the described case, the timing of the AND gate may be ignored. If a logic AND gate has a first input port driven by a constant logic 1, the output of the AND gate will change based upon the value of the signal provided to the other input of the AND gate. In the latter case, the system preserves the path with the unknown signal value since that signal determines timing for the AND gate. Accordingly, circuits that provide the constant must be preserved as described to retain equivalent timing in the shell circuit design.

In block 415, for example, the system is capable of determining ports of the platform design that connect to the selected module black-box instance and that correspond to a constant. Such ports may include, for example, ports driven directly by vcc/gnd, driven by constant outputs of upstream cells (e.g., a constant LUT output), or designated as constant in the platform design (e.g., set_case_analysis sdc constraint, etc.). The system, for example, is capable of inspecting the module black-box instance to determine whether each port is a constant. After identifying a constant port, the system is capable of performing a backward breadth first search to mark ports in the fan-in cone of the constant port.

In another example, consider the case of a flip-flop connected to logic, connected to a multiplexer, connected to further logic, connected to a port of the module black-box instance. In this example, the select signal provided to the multiplexer may be controlled by a constant (e.g., constant logic or through a set_case_analysis sdc constraint). In that case, the system preserves the topology of the select signal to ensure that the correct (e.g., active) path through the multiplexer is available for timing analysis.

The examples described in connection with block 415 are provided for purposes of illustration. It should be appreciated that other scenarios result in the system marking portions of the topology of the platform design with constants propagating into marked objects and/or constants propagating into the module black-box instance.

In block 420, the system marks any clock net loads of the platform design that are dependent on placement for preservation of their delay characteristics. In block 425, the system marks all inputs of any LUTs of the platform design that have at least one input or at least one output marked. Thus, for any LUT that has at least one input or at least one output marked, the system marks each other input of the LUT. Marking performed in block 425 avoids complications arising from the different timing paths through the LUT. Preserving the entire LUT ensures that the same timing paths are preserved in the shell circuit design. Further, by evaluating whether input and outputs of LUTs are marked, the system is able to preserve single input LUTs where only the output of the LUT was marked. Otherwise, a single input LUT with only the output marked would propagate a constant 0, which may differ from what the circuit element would propagate had the input also been preserved.

In block 430, the system marks full contents of any partially marked primitive macro circuit block of the platform design. Block 430 ensures that the resulting shell circuit design includes complete versions of primitive macro circuit blocks rather than including only a portion of a primitive macro circuit block. Examples of primitive macro circuit blocks include, but are not limited to, digital signal processing (DSP) blocks, block RAMs, and different types of LUTs. Block 430 ensures that primitive macro circuit blocks are not decomposed so that a portion of such circuit block is removed from the shell circuit design while another portion of the circuit block remains within the shell circuit design. Block 430 also ensures that timing arcs through such circuit blocks are preserved in the resulting shell circuit design.

In block 435, the system ensures at least one leaf driver is marked for each leaf load of the platform design. For example, the system detects each leaf load of the platform design. The system checks whether at least one leaf driver is marked for each identified leaf load. In response to determining that a given leaf load does not have at least one driver marked, the system marks at least one of the leaf drivers of the leaf load. Block 430 ensures that there are no dangling, e.g., unconnected, leaf loads, left in the platform design.

In block 440, the system removes any unmarked objects of the platform design to generate the shell circuit design. In block 445, the system is capable of determining which of the timing constraints of the platform design relate to objects that are still included in the resulting shell circuit design. The system, for example, is capable of storing a list of these timing constraints in association with the shell circuit design. This allows the system to recall the relevant timing constraints for the shell circuit design at a future time. Appreciably, the timing constraints for the shell circuit design is a subset of the timing constraints for the platform design.

Figure 5:
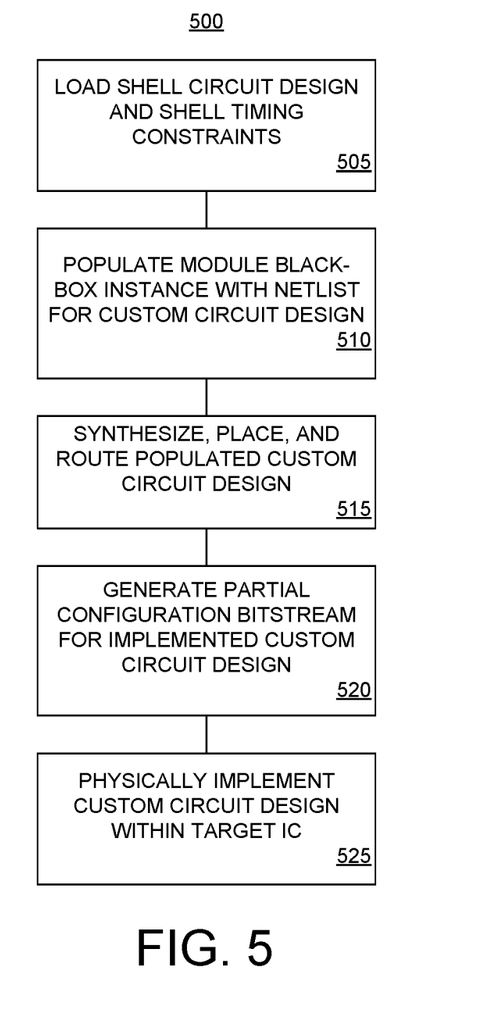
FIG. 5 illustrates an example method of implementing a custom circuit design using a shell circuit design.

FIG. 5 illustrates an example method 500 of implementing a custom circuit design using a shell circuit design. In particular embodiments, method 500 may be performed to implement block 340 of FIG. 3. Method 500 illustrates the implementation of a single custom circuit design. It should be appreciated that method 500 may be iterated as needed to implement further custom circuit designs for use with the platform design.

In block 505, the system loads a shell circuit design and the timing constraints for the shell circuit design (referred to herein as the "shell timing constraints") into runtime memory. In block 510, the system populates the module black-box instance of the shell circuit design with the netlist of the custom circuit design that is to be implemented. For example, the system loads the netlist of the custom circuit design into the module black-box instance associated with the custom circuit design. In block 515, the system is capable of synthesizing, placing, and routing the custom circuit design. The system performs the design flow operations using the shell circuit design and the shell timing constraints. This ensures that the custom circuit design correctly integrates with the platform design and that boundary crossings meet established timing constraints. In block 520, the system is capable of generating a partial configuration bitstream for the implemented custom circuit design.

In block 525, the system (or another system such as a host system in a computing environment that uses hardware acceleration) is capable of physically implementing the implemented custom circuit design within the target IC. For example, the system is capable of causing the partial configuration bitstream generated in block 520 to be loaded into the target IC thereby physically implementing the circuitry of the custom circuit design in the PR region of the target IC. In block 525, it should be appreciated that a partial configuration bitstream (or a full configuration bitstream) specifying the platform design is already loaded into the target IC.

The embodiments described within this disclosure allow a custom circuit design to be implemented using the shell circuit design where the resulting implementation of the custom circuit design has timing consistency, e.g., the same timing characteristics, as if the custom circuit design had been implemented using the full platform design. The timing consistency is guaranteed if the shell circuit design is generated and used as described herein.

Figure 6:
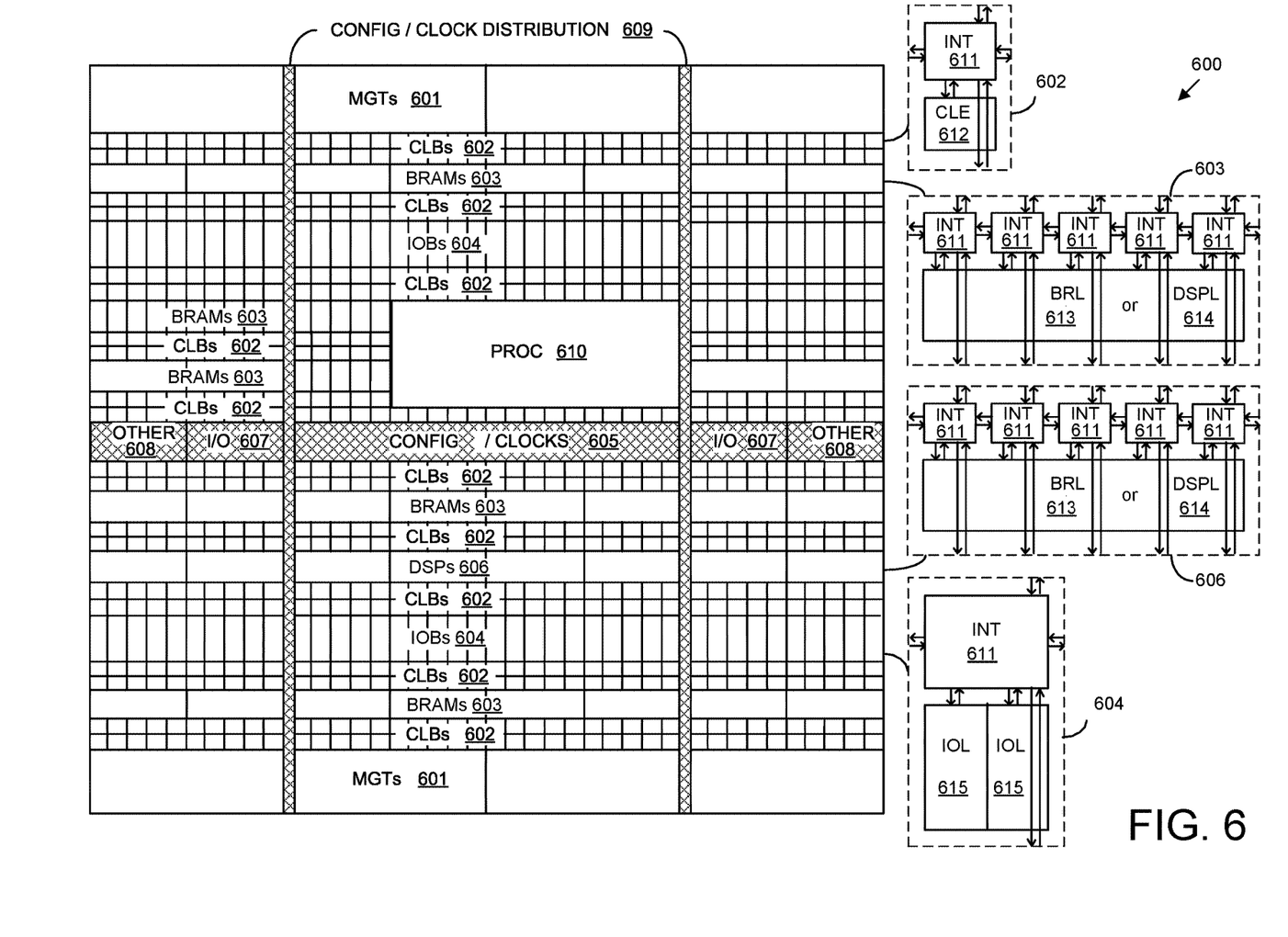
FIG. 6 illustrates an example architecture for an IC.

FIG. 6 illustrates an example architecture 600 for an IC. In one aspect, architecture 600 may be implemented within a programmable IC. For example, architecture 600 may be used to implement a field programmable gate array (FPGA). Architecture 600 may also be representative of a system-on-chip (SOC) type of IC. An SOC is an IC that includes a processor that executes program code and one or more other circuits. The other circuits may be implemented as hard-wired circuitry, programmable circuitry, and/or a combination thereof. The circuits may operate cooperatively with one another and/or with the processor.

As shown, architecture 600 includes several different types of programmable circuit, e.g., logic, blocks. For example, architecture 600 may include a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized I/O blocks 607 (e.g., configuration ports and clock ports), and other programmable logic 608 such as digital clock managers, analog-to-digital converters, system monitoring logic, and so forth.

In some ICs, each programmable tile includes a programmable interconnect element (INT) 611 having standardized connections to and from a corresponding INT 611 in each adjacent tile. Therefore, INTs 611, taken together, implement the programmable interconnect structure for the illustrated IC. Each INT 611 also includes the connections to and from the programmable logic element within the same tile, as shown by the examples included at the top of FIG. 6.

For example, a CLB 602 may include a configurable logic element (CLE) 612 that may be programmed to implement user logic plus a single INT 611. A BRAM 603 may include a BRAM logic element (BRL) 613 in addition to one or more INTs 611. Typically, the number of INTs 611 included in a tile depends on the height of the tile. As pictured, a BRAM tile has the same height as five CLBs, but other numbers (e.g., four) also may be used. A DSP tile 606 may include a DSP logic element (DSPL) 614 in addition to an appropriate number of INTs 611. An 10B 604 may include, for example, two instances of an I/O logic element (IOL) 615 in addition to one instance of an INT 611. The actual I/O pads connected to IOL 615 may not be confined to the area of IOL 615.

In the example pictured in FIG. 6, a columnar area near the center of the die, e.g., formed of regions 605, 607, and 608, may be used for configuration, clock, and other control logic. Horizontal areas 609 extending from this column may be used to distribute the clocks and configuration signals across the breadth of the programmable IC.

Some ICs utilizing the architecture illustrated in FIG. 6 include additional logic blocks that disrupt the regular columnar structure making up a large part of the IC. The additional logic blocks may be programmable blocks and/or dedicated circuitry. For example, a processor block depicted as PROC 610 spans several columns of CLBs and BRAMs.

In one aspect, PROC 610 may be implemented as dedicated circuitry, e.g., as a hardwired processor, that is fabricated as part of the die that implements the programmable circuitry of the IC. PROC 610 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 610 may be omitted from architecture 600 and replaced with one or more of the other varieties of the programmable blocks described. Further, such blocks may be utilized to form a "soft processor" in that the various blocks of programmable circuitry may be used to form a processor that can execute program code as is the case with PROC 610.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 6 that are external to PROC 610 such as CLBs 602 and BRAMs 603 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 610. Other examples of hardened circuit blocks include direct memory access circuit blocks, bus endpoints, and memory controllers (not shown) which may also be included within architecture 600.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream may specify the circuitry that is to be implemented within the programmable circuitry and the program code that is to be executed by PROC 610 or a soft processor. In some cases, architecture 600 includes a dedicated configuration processor that loads the configuration bitstream to the appropriate configuration memory and/or processor memory. The dedicated configuration processor does not execute user-specified program code. In other cases, architecture 600 may utilize PROC 610 to receive the configuration bitstream, load the configuration bitstream into appropriate configuration memory, and/or extract program code for execution.

FIG. 6 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 6 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 610 within the IC are for purposes of illustration only and are not intended as limitations.

The inventive arrangements described herein result in significantly reduced runtimes, reduced peak memory usage, and reduced amount of logic/circuitry of the platform design that needs to be considered when a computing system implements a custom circuit design. For example, the amount of logic/circuitry of the platform design that may be removed to generate the shell circuit design is, in some cases, as high as approximately 90%. This reduction leads to a runtime reduction of the computing system of approximately 40% and a reduction of peak memory usage of approximately 25%. These results provide computing performance improvements over techniques that do not use a shell circuit design as well as techniques that, while using a shell circuit design, generate the shell circuit design by keeping timing constrained circuitry that may not be relevant to the portion of the platform circuit design that connects to the custom circuit design.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "processor" means at least one hardware circuit. The hardware circuit may be configured to carry out instructions contained in program code. The hardware circuit may be an integrated circuit. Examples of a processor include, but are not limited to, a central processing unit (CPU), an array processor, a vector processor, a digital signal processor (DSP), an FPGA, a programmable logic array (PLA), an ASIC, programmable logic circuitry, and a controller.

As defined herein, the term "output" means storing in physical memory elements, e.g., devices, writing to display or other peripheral output device, sending or transmitting to another system, exporting, or the like.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

In one or more embodiments, a method includes loading, using computer hardware, a platform design including a module black-box instance, identifying, using the computer hardware, synchronous boundary crossings between a static region and the module black-box instance of the platform design, and marking, using the computer hardware, objects of the platform design included in the synchronous boundary crossings. The method further includes removing, using the computer hardware, unmarked objects from the platform design to generate a shell circuit design and implementing, using the computer hardware, a custom circuit design based on the shell circuit design and timing constraints corresponding to objects remaining in the shell circuit design.

In one aspect, the marking includes marking constant paths of the shell circuit design that propagate into a marked circuit element of the platform design.

In another aspect, the marking includes marking feedback loops that include phase-lock loop circuit blocks of the platform design.

In another aspect, the marking includes marking feedback loops that include mixed model clock manager circuit blocks of the platform design.

In another aspect, the marking includes marking clock net loads of the shell circuit design that are dependent on placement for delay preservation.

In another aspect, the marking includes marking full contents of each primitive macro of the platform design that include at least one marked circuit element.

In another aspect, the marking includes determining each marked circuit element that is a leaf load, determining each driver of each marked circuit element that is a leaf load, and, for each marked circuit element that is a leaf load, in response to determining that no driver of the marked circuit element that is a leaf load is marked, marking a driver of the marked circuit element that is a leaf load.

In another aspect, the marking includes marking each input of a lookup table that has at least one input or at least one output marked.

In another aspect, the implementing includes determining the timing constraints of the platform design that are associated with objects in the shell circuit design.

In another aspect, the implementing includes synthesizing, placing, and routing the custom circuit design.

In one or more embodiments, a system includes a memory configured to store program code and a processor coupled to the memory. The processor, in response to executing the program code, is configured to initiate operations. The operations can include loading a platform design including a module black-box instance, identifying synchronous boundary crossings between a static region and the module black-box instance of the platform design, marking objects of the platform design included in the synchronous boundary crossings, removing unmarked objects from the platform design to generate a shell circuit design, implementing a custom circuit design based on the shell circuit design and timing constraints corresponding to objects remaining in the shell circuit design.

In one aspect, the marking includes marking constant paths of the shell circuit design that propagate into a marked circuit element of the platform design.

In another aspect, the marking includes marking feedback loops that include phase-lock loop circuit blocks of the platform design.

In another aspect, the marking includes marking feedback loops that include mixed model clock manager circuit blocks of the platform design.

In another aspect, the marking includes marking clock net loads of the shell circuit design that are dependent on placement for delay preservation.

In another aspect, the marking includes marking full contents of each primitive macro of the platform design that include at least one marked circuit element.

In another aspect, the marking includes determining each marked circuit element that is a leaf load, determining each driver of each marked circuit element that is a leaf load, for each marked circuit element that is a leaf load, in response to determining that no driver of the marked circuit element that is a leaf load is marked, marking a driver of the marked circuit element that is a leaf load.

In another aspect, the marking includes marking each input of a lookup table that has at least one input or at least one output marked.

In another aspect, the implementing includes determining the timing constraints of the platform design that are associated with objects in the shell circuit design.

In another aspect, the implementing includes synthesizing, placing, and routing the custom circuit design.

In one or more embodiments, a computer program product includes a computer readable storage medium having program code stored thereon. The program code is executable by a processor to perform operations. The operations can include loading a platform design including a module black-box instance, identifying synchronous boundary crossings between a static region and the module black-box instance of the platform design, marking objects of the platform design included in the synchronous boundary crossings, removing unmarked objects from the platform design to generate a shell circuit design, and implementing a custom circuit design based on the shell circuit design and timing constraints corresponding to objects remaining in the shell circuit design.

In one aspect, the implementing includes synthesizing, placing, and routing the custom circuit design.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
   loading, using computer hardware, a platform design including a module black-box instance, wherein the platform design is a circuit design that is placed and routed and the module black-box instance is empty;
   identifying, using the computer hardware, synchronous boundary crossings between the platform design and the module black-box instance, wherein the synchronous boundary crossings include a partition pin of the module black-box instance, a first synchronous circuit element along on a signal path from the partition pin into the platform design, and logic between the partition pin and the first synchronous circuit element;
   marking, at least in part and using the computer hardware, objects of the platform design included in the synchronous boundary crossings;
   removing, using the computer hardware, unmarked objects from the platform design to generate a shell circuit design; and
   implementing, using the computer hardware, a custom circuit design for inclusion in the module black-box instance based on the shell circuit design and timing constraints corresponding to objects remaining in the shell circuit design.

2. The method of claim 1, wherein the marking comprises:
   marking constant paths of the platform design that propagate into a marked circuit element of the platform design.

3. The method of claim 1, wherein the marking comprises:
   marking feedback loops that include phase-lock loop circuit blocks of the platform design.

4. The method of claim 1, wherein the marking comprises:
   marking feedback loops that include mixed model clock manager circuit blocks of the platform design.

5. The method of claim 1, wherein the marking comprises:
   marking clock net loads of the platform design that are dependent on placement for delay preservation.

6. The method of claim 1, wherein the marking comprises:
   marking full contents of each primitive macro of the platform design that include at least one marked circuit element.

7. The method of claim 1, wherein the marking comprises:
   determining each marked circuit element that is a leaf load;
   determining each driver of each marked circuit element that is a leaf load; and
   for each marked circuit element that is a leaf load, in response to determining that no driver of the marked circuit element that is a leaf load is marked, marking a driver of the marked circuit element that is a leaf load.

8. The method of claim 1, wherein the marking comprises:
   marking each input of a lookup table that has at least one input or at least one output marked.

9. The method of claim 1, wherein the implementing comprises:
   determining the timing constraints of the platform design that are associated with objects in the shell circuit design.

10. The method of claim 1, wherein the implementing comprises:
    synthesizing, placing, and routing the custom circuit design.

11. A system, comprising:
    a memory configured to store program code; and
    a processor coupled to the memory, wherein the processor, in response to executing the program code, is configured to initiate operations including:
    loading a platform design including a module black-box instance, wherein the platform design is a circuit design that is placed and routed and the module black-box instance is empty;
    identifying synchronous boundary crossings between the platform design and the module black-box instance, wherein the synchronous boundary crossings include a partition pin of the module black-box instance, a first synchronous circuit element along on a signal path from the partition pin into the platform design, and logic between the partition pin and the first synchronous circuit element;
    marking, at least in part, objects of the platform design included in the synchronous boundary crossings;
    removing unmarked objects from the platform design to generate a shell circuit design; and
    implementing a custom circuit design for inclusion in the module black-box instance based on the shell circuit design and timing constraints corresponding to objects remaining in the shell circuit design.

12. The system of claim 11, wherein the marking comprises:
    marking constant paths of the platform design that propagate into a marked circuit element of the platform design.

13. The system of claim 11, wherein the marking comprises:
    marking feedback loops that include phase-lock loop circuit blocks of the platform design.

14. The system of claim 11, wherein the marking comprises:
    marking feedback loops that include mixed model clock manager circuit blocks of the platform design.

15. The system of claim 11, wherein the marking comprises:
    marking clock net loads of the platform design that are dependent on placement for delay preservation.

16. The system of claim 11, wherein the marking comprises:
    marking full contents of each primitive macro of the platform design that include at least one marked circuit element.

17. The system of claim 11, wherein the marking comprises:
    determining each marked circuit element that is a leaf load;

determining each driver of each marked circuit element that is a leaf load; and for each marked circuit element that is a leaf load, in response to determining that no driver of the marked circuit element that is a leaf load is marked, marking a driver of the marked circuit element that is a leaf load.

18. The system of claim 11, wherein the marking comprises:

marking each input of a lookup table that has at least one input or at least one output marked.

19. The system of claim 11, wherein the implementing comprises:

determining the timing constraints of the platform design that are associated with objects in the shell circuit design.

20. A computer program product, comprising:

a computer readable storage medium having program code stored thereon, wherein the program code is executable by computer hardware to initiate operations including:

loading a platform design including a module black-box instance, wherein the platform design is a circuit design that is placed and routed and the module black-box instance is empty;

identifying synchronous boundary crossings between the platform design and the module black-box instance of the platform design, wherein the synchronous boundary crossings include a partition pin of the module black-box instance, a first synchronous circuit element along on a signal path from the partition pin into the platform design, and logic between the partition pin and the first synchronous circuit element;

marking, at least in part, objects of the platform design included in the synchronous boundary crossings;

removing unmarked objects from the platform design to generate a shell circuit design; and implementing a custom circuit design for inclusion in the module black-box instance based on the shell circuit design and timing constraints corresponding to objects remaining in the shell circuit design.

\* \* \* \* \*